United States Patent [19]

Cozzi

[11] Patent Number: 4,799,021

[45] Date of Patent: Jan. 17, 1989

[54] METHOD AND APPARATUS FOR TESTING EPROM TYPE SEMICONDUCTOR DEVICES DURING BURN-IN

[75] Inventor: Lucio Cozzi, Agrate Brianza, Italy

[73] Assignee: SGS Microelettronica S.p.A., Catania, Italy

[21] Appl. No.: 73,654

[22] Filed: Jul. 15, 1987

[30] Foreign Application Priority Data

Jul. 22, 1986 [IT] Italy .................. 83633 A/86

[51] Int. Cl.$^4$ .................. G01R 1/04; G01R 31/00
[52] U.S. Cl. .................. 324/73 R; 324/158 R; 324/158 F; 371/21
[58] Field of Search ............ 324/158 P, 158 F, 158 R, 324/73 R; 371/21; 365/1

[56] References Cited

U.S. PATENT DOCUMENTS

| | | | |
|---|---|---|---|
| 4,578,751 | 3/1986 | Erwin .................................. | 371/21 |
| 4,636,726 | 1/1987 | Santomango et al. .......... | 324/158 F |
| 4,695,707 | 9/1987 | Young ............................. | 324/158 F |
| 4,713,611 | 12/1987 | Solstad et al. .................. | 324/158 F |

FOREIGN PATENT DOCUMENTS 0172132  2/1986  European Pat. Off. ........ 324/158 F

Primary Examiner—Reinhard J. Eisenzopf
Assistant Examiner—W. Burns
Attorney, Agent, or Firm—Pollock, Vande Sande & Priddy

[57] ABSTRACT

An apparatus and a relative method which permit carrying out a complete cycle of functional tests and parametric measurements on EPROM type semiconductor devices during their permanence inside a burn-in chamber, thus greatly reducing the time necessary for testing and classifying the devices, besides ensuring a higher reliability. The system utilizes special "intelligent" cards, i.e. provided with a card microprocessor which may be connected to a supervisory system's CPU directing the test and classification process of the devices.

6 Claims, 4 Drawing Sheets

METHOD AND APPARATUS FOR TESTING EPROM TYPE SEMICONDUCTOR DEVICES DURING BURN-IN

The present invention generally relates to the production techniques of integrated circuits and, more particularly, to the quality control procedures which, inserted as they are in the manufacturing flow, may be considered under many aspects an integral part of the production process itself.

The present invention concerns, in fact, an apparatus and a method for testing the functions and parametric characteristics of integrated circuits, particularly of integrated circuits containing sections of read-only type EPROM memory (acronym of Erasable Programmable Read-Only Memory).

The quality and reliability of semiconductor devices are based, besides on the technology employed in the fabrication process, on a series of tests to which the product is subjected before being delivered to the user.

One of the tests regarded as one of the most severe is that of subjecting the devices to particularly high temperatures; typically between 85° C. and 150° C., for accelerating infant mortalities in a population of semiconductor devices. This test, also known among the experts of the field as "burn-in" has the objective of provoking or otherwise stimulating the failure of those devices which have developed some defects during the fabrication process and/or during handling and whose structure thus contains some element of precariousness.

Since the burn-in treatment requires that thousands of devices be plugged into parallel sockets mounted on appropriate cards suitable to be inserted in a heat treatment chamber for a considerable number of hours, it becomes economically desirable to be able to perform a series of functional tests of the devices during their "captivity" into the burn-in chamber. This demand has intensified as memories and logic devices have become increasingly dense and complex, thus requiring increasingly longer test times.

For example, the time required to run an $N^2$ test pattern on a typical 16K RAM, is about a minute; for a 64K RAM, it increases to about 30 minutes; and for a 256K RAM, it becomes 8 hours. Such test times are, on the other hand, easily accomodated in the times necessary to effect the burn-in treatment. Adequate functional testing during burn-in requires sophisticated pattern-generation and advanced control and data-processing capabilities. Test programs must be under the control of a central processing unit (CPU) that is capable of monitoring inputs and outputs of the devices under test to verify the validity of the tests. The possibility of effecting functional tests while the devices are kept at high temperatures, becomes particularly important in the case of EPROM type devices. The working temperature is, in fact, directly responsible of the recombination or loss of electrical charges stored in the permanent memory element represented by a "floating gate" structure, which is the site of the data programmed in the device by injection of a certain electrical charge in such a floating structure, i.e. completely insulated from the rest of the circuit.

The higher the temperature, the higher the probability that electrical charges stored in the floating gate acquire sufficient energy to overcome the potential barrier represented by the insulation thus disappearing from their assigned site and thus modifying the information stored therein.

Moreover, EPROM devices, in contrast with other devices such as microprocessors and random access memories (RAM), show another peculiarity typical of their function: they must be programmed with a specific content and then checked for their function. Thereafter in order to confirm their function with a different content, the same devices must be erased by exposure to a U.V. (ultraviolet) radiation for about 10–15 minutes.

This erasing operation is of great encumbrance in the flow relative to the last steps of the production process which includes the burn-in treatment too. According to prior art methods, it is necessary to remove from the burn-in chamber the devices for subjecting them to U.V. radiation and thence to replug them into the sockets of the cards to be reinserted into the burn-in chambers. Because of these difficulties, it is usually preferred to effect the burn-in test with a single content of the devices (i.e. with a single test pattern programmed into the devices) with an evident degradation of the qualitative objectives of the test itself.

The system object of the present invention overcomes completely the above noted program and permits effecting entire series of functional tests for checking the content of the appropriately programmed memory cells, of tests to establish the parametric (DC) characteristics of the devices, of dynamic tests to verify the access time (TAC) and of recording the classification for a subsequent marking of the devices, during the time they remain inside the burn-in chamber, thus efficiently integrating such tests with the thermal burn-in treatment itself.

According to one of the main aspects of the system of the invention, the apparatus for testing the function and the characteristics of EPROM type semiconductor devices during burn-in, comprises means for erasing the EPROM by irradiating them with U.V. light, means for programming the EPROM, means for verifying the effected programming, means for effecting the burn-in of the programmed devices, means for verifying the retention of programmed data, means for measuring the parametric (DC) and dynamic (TAC) characteristics of the devices and means for classifying and handling the single devices. The apparatus comprises essentially:

(a) at least a burn-in chamber provided, over at least a wall thereof, with a plurality of slots having closing means and suitable to receive a card assembly;

(b) a plurality of system's card assemblies, each comprising a first portion provided with a plurality of sockets for plugging in devices and a second part containing a microprocessor, between said two parts of the card assembly is a plugging body shaped in a way as to match with said slots so that said second part of the card remains outside said chamber upon insertion of the card into a slot;

(c) a plurality of cards containing one or more U.V. lamps, each card comprising a first part provided with said one or more U.V. lamps and a second part containing switching means and electrical supply means for said lamps, a plugging body sealingly insertable into said slots being present between said two parts of the card so that said second part of the card remains outside said chamber upon insertion of the card into a receiving slot;

(d) a CPU interfaced with each microprocessor of said system's cards and with the switching means of said U.V. lamps containing cards.

A back-end flow diagram of a manufacturing process incorporating the test method of the invention for determining the correct function and the characteristics of EPROM type semiconductor devices during the burn-in treatment, comprises the following steps:

(A) programming to an "all 0" pattern the cells of the EPROM devices as received from the assembly lines;

(B) loading the devices into tubes and storing the tubes at a temperature equal to or greater than 170° C. for at least 72 hours;

(C) automatic loading of single devices from said tubes on system's cards provided with suitable sockets, verification, upon plugging-in of the devices, of the validity of the data programmed during step (A) and automatic rejection of nonvalidated devices;

(D) dynamic burn-in treatment at a temperature equal to or greater than 125° C. carried out in a burn-in chamber and subjecting the devices plugged into said sockets of said cards to the following tests:
 (i) verification of the "0" status of all the EPROM cells;
 (ii) erasing;
 (iii) programming of a test pattern;
 (iv) verification of the test pattern;
 (v) repetition of steps (ii), (iii) and (iv) for an "n" number of different test patterns;
 (vi) classification of the single devices according to particular quality classes;
 (vii) programming of a special pattern for subsequent testing;

(E) automatic unplugging of the devices from the sockets of said system's cards and their classification by automatic insertion of the devices into classified tubes in accordance with particular quality grades;

(F) testing of dynamic (TAC) parameters of the devices and further classification of devices in function of the determined individual dynamic characteristics;

(G) stamping of the devices and final erasing of the data still present in the memory cells.

The invention, its different aspects and advantages will be more easily understood through the following description, having a purely illustrative and nonlimitative character, of a preferred embodiment of the invention illustrated also by a series of annexed drawings, wherein FIG. 1 is a perspective view of two integrated burn-in, functional testing, AC and DC parametric testing systems for EPROM type semiconductor devices in accordance with the present invention;

Figure 1:
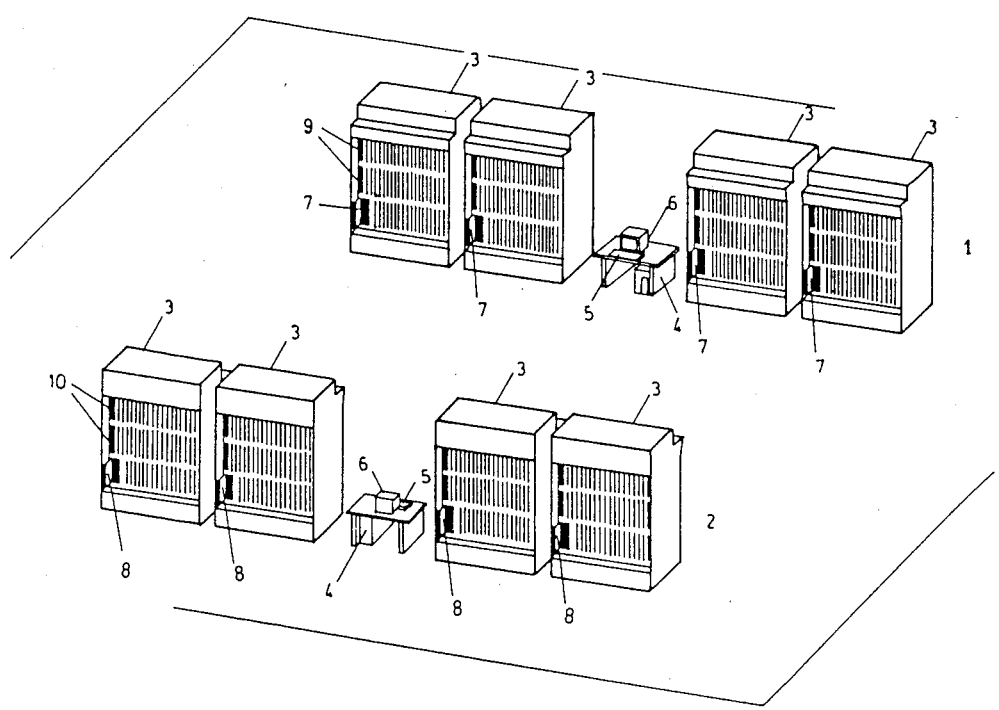

FIG. 1 shows the general architecture of the system of the invention. In FIG. 1 two substantially identical distinct systems, generally indicated with 1 and 2, are shown. Each distinct system has a proper console 4, associated with a CPU, and which is provided with a key board 5 and monitor 6. Each system comprises one or more ovens 3, provided with heating means and with means for controlling the temperature inside the chamber of the oven, preferably under control of the CPU. On at least a wall and more preferably on two opposite walls of each oven, there is a series of "windows" (or slots), individually provided with closing means. The windows present on the front wall of the ovens 3, shown in FIG. 1, are indicated with 9, while the windows present on the back wall of the ovens are indicated with 10. Such windows or slots 9 and 10 permit the insertion inside the oven 3 of an equal number of cards 7 and 8.

Figure 2:
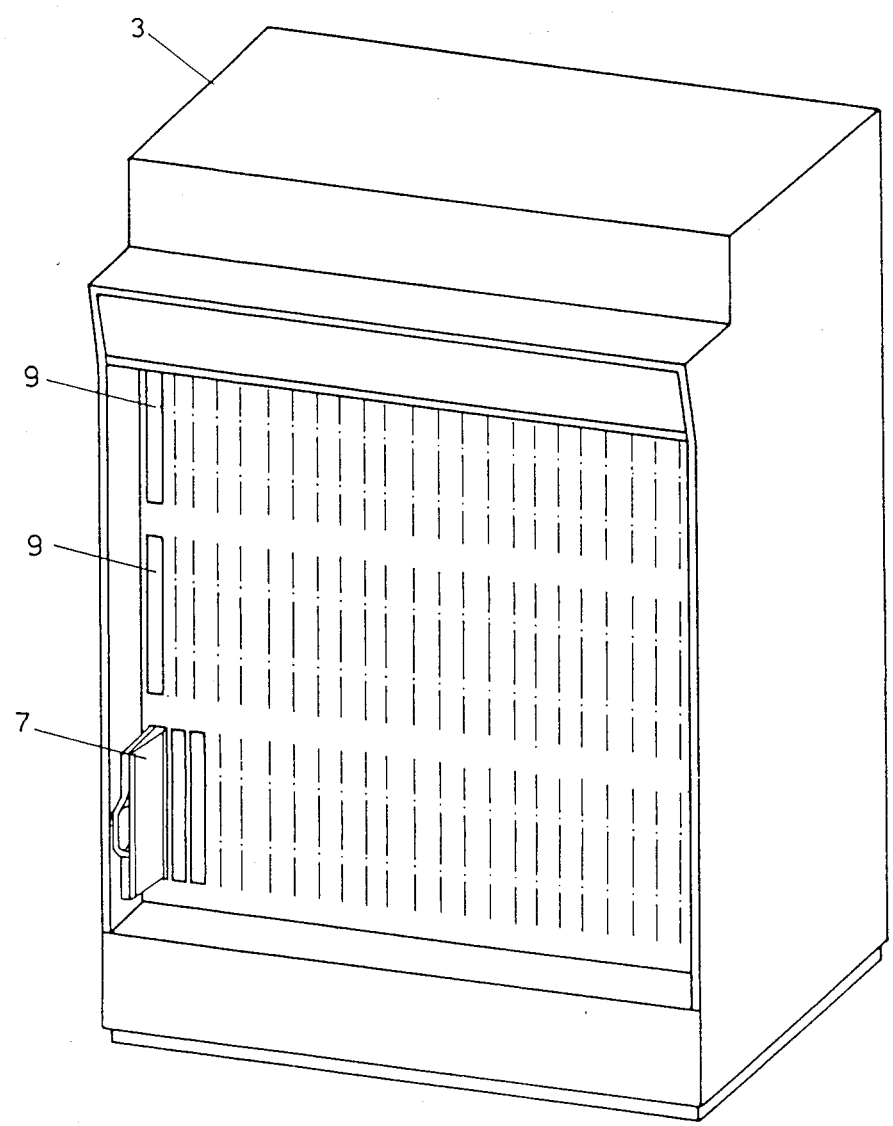
FIG. 2 is an enlarged view of the front portion of one of the ovens or heat treatment chambers used in the system of the invention.

The enlarged showing of a single oven 3 in FIG. 2 permits observation in greater detail, of the arrangement of such windows 9 on the front side of the oven 3 as well as of a card 7, inserted into one of such slots.

Figure 3:
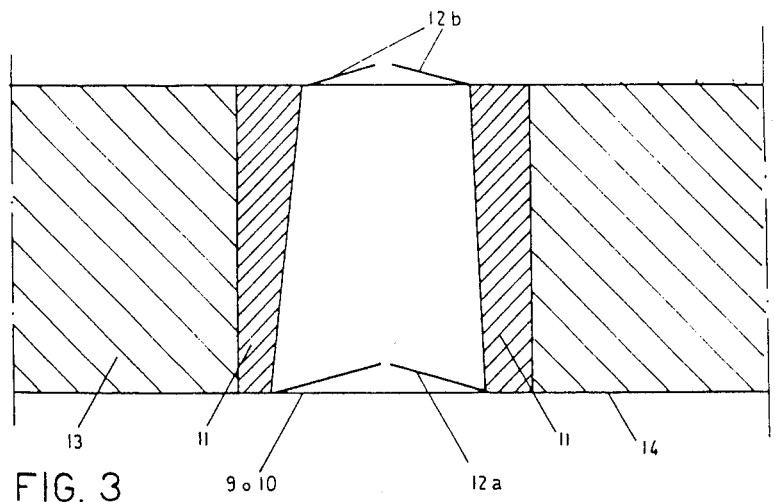
FIG. 3 is a partial sectional view of one of the "windows" or slots for inserting cards containing the devices to be tested present on front and back walls of the ovens.

FIG. 3 shows the configuration of each of said windows 9 or 10. Each window or slot is defined through the insulating wall of the oven 13 by a frame 11 fitted in a suitable opening cut through said wall 13 and having an aperture or central port of a substantially rectangular section which extends through the thickness of said frame in a tapering way to form a slot having a truncated pyramid passage whose major base corresponds with the external surface 14 of the oven and whose minor base corresponds with the internal surface 15 of the oven chamber wall.

The closing means of each individual slot may be advantageously formed by two pairs of flaps, 12a and 12b, suitably hinged and provided with elastic return means (e.g. springs) as to automatically close when a card is not inserted through the slot. Naturally other automatic means for closing the aperture of the slots in absence of cards inserted through the same may be devised and utilized for the purpose.

Preferably the frame 11 is made with a heat insulating material to avoid constituting a heat bridge between the internal chamber of the oven and the room environment.

Figures 4, 5:
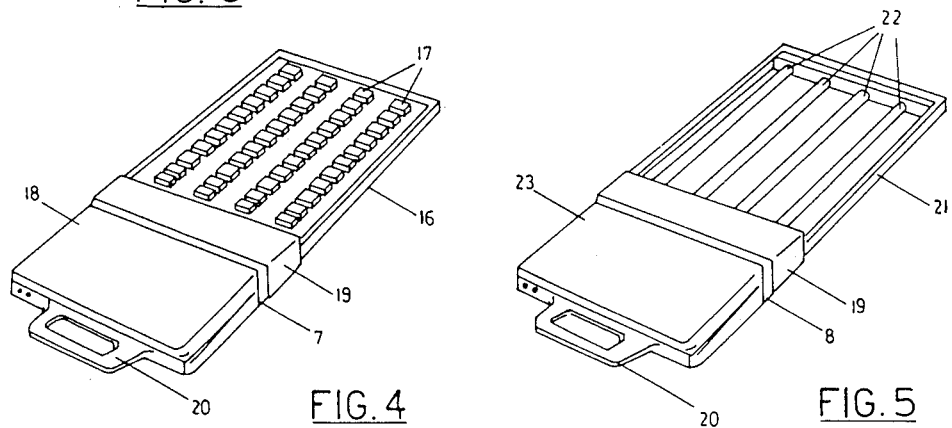
FIG. 4 is a schematic, perspective view of one of the system's cards.
FIG. 5 is a schematic, perspective view of one of the cards containing U.V. lamps used in the system of the invention.

The system utilizes a plurality of cards 7 having the configuration shown in FIG. 4. A card 7 comprises two parts or sections; a first part 16 is provided, on a face thereof, with a plurality of parallel connected sockets into which an equal number of EPROM devices, 17, to be subjected to burn-in and to be tested may be plugged, and a second part or section 18 containing a microprocessor typically formed by a central processing unit, a read-only memory, a random access memory, as well as input and output interfacing stages (CPU, ROM, RAM, I/0). The two parts 16 and 18 are separated by a central body 19, shaped as a truncated pyramid with rectangular base, matching with the central opening of the frame 11 of said windows 9. Such a central coupling body 19 will be also preferably made of insulating material.

The card may be provided with a handle 20 for improving handling thereof.

Means, not shown, for connecting the card's microprocessor to the system's CPU as well as to the power supply are also contemplated within the portion 18 of each card.

The configuration of the second type of cards utilized by the apparatus of the present invention is shown in FIG. 5. This second type of cards comprises a frame 21 capable of accommodating one or, preferably, more U.V. lamps 22 functionally mounted in appropriate sockets fixed to the frame 21. A central body 19, having a truncated pyramid shape similar to that of the system's card described in FIG. 4, provides coupling means with the opening of said windows 10 in the wall of the oven. In the part 23 of the card which remains outside of the oven chamber when the card is inserted into one of the slots, there are supply and switching means for the U.V. lamps 22 as well as means for the electric interconnection to the rest of the system's circuit. Also this second type of card 8 may be conveniently provided with a handle 20.

Figure 6:
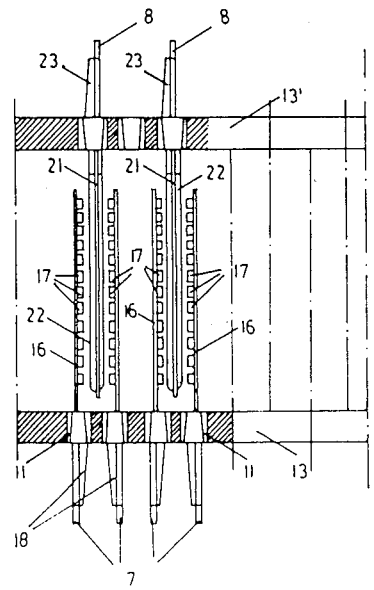
FIG. 6 is a partial, schematic, sectional, plan view of one of the ovens used in the system of the invention, showing the arrangment of the different cards inside the oven.
Figure 7:
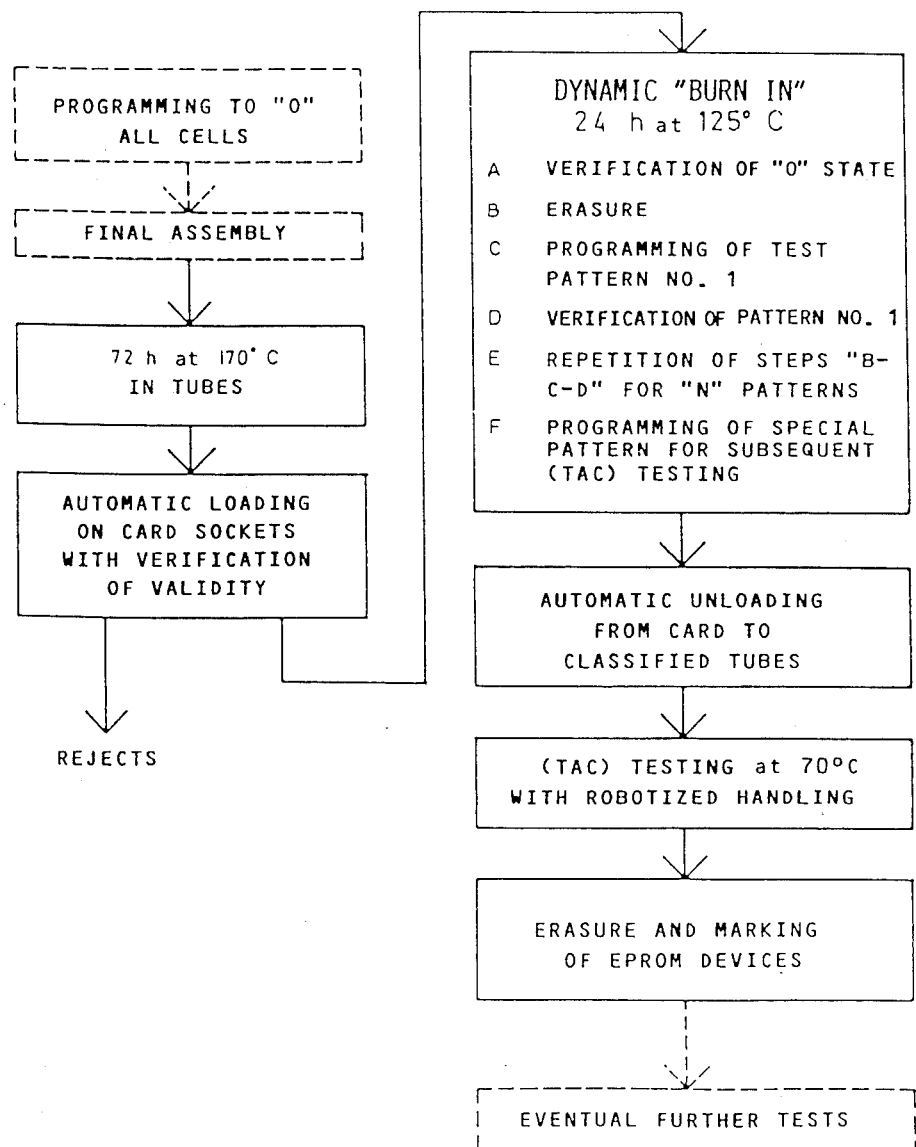
FIG. 7 shows a functional flow diagram of the method of the invention.

The relative arrangement into the oven of the two types of cards, i.e. of the devices carrying cards 7 and of the U.V. lamps cards 8, is shown in FIG. 6.

Essentially, the relative arrangement of the two types of cards inside the oven's chamber is such that each card 8 carrying the U.V. lamps is inserted between a pair of devices carrying cards 7 which are mounted so as to ensure that the devices 17, arranged on one of the two sides of each of the pair of cards, be opposing the U.V. lamps 22 mounted on the card 8. Preferably, the devices cards 7 are mounted through the slots of the front wall 13 of the ovens, while the U.V. lamp cards 8 are suitably inserted through slots of the back wall 13' of the ovens.

As it may be easily observed in the schematic showing of FIG. 6, upon insertion, the portion 18 of the devices cards 7 containing the microprocessors and the portion 23 of the U.V. lamps cards 8, containing the switching means for the lamps, remain outside the hot chamber of the oven.

The microprocessor contained in the external portion 18 of the devices cards 7 executes, among others, the following functions:

(A) suitably elaborate the signals sent to the EPROM devices being tested mounted on the card as to perform the programming and verification functions of the data content by performing pre-established different test patterns; classifies the devices into quality categories in function of the checked performances and detects rejects;

(B) interfaces with the system's CPU, receiving from the latter supervisory commands relative to the operations to be performed on the EPROM devices, communicates back to the system's CPU the results of these operations; this information will be stored by the CPU for subsequently governing the "intelligent" unloading of the devices from the burn-in cards.

The system's CPU also provides for sending the switch-on and switch-off signals for the U.V. lamps mounted on the various cards 8 for carrying out the erasing operations of the data programmed into the EPROM devices being tested during specific phases of the entire burn-in cycle and of the functional testing and of the determination of the parametric characteristics of the devices.

Therefore, the system's CPU performs a general supervisory function of the system determining the contemplated test sequence during the burn-in heat treatment. The CPU records and processes data generated by the testing and it is capable of directing the "intelligent" unloading of the EPROM devices from the test cards at the end of the cycle, by guiding the action of an unloading "robot" which will unplug one by one the devices from each card, placing each device in a classified container or tube in function of the detected and recorded performances of each individual device.

Such procedures for the classification of EPROM devices in accordance with their quality, as well as such means and procedures for the automation of handling and selection of the devices are well known to the expert technician of the field and therefore, in order not to unduly burden the present specification, will not be described, referring the reader to the vast and easily accessible literature on this particular topic.

A presently preferred flow chart of the process of the invention is shown in FIG. 1. Such a flow chart may be considered indicative of a back-end production flow of EPROM type semiconductor devices.

The single devices whose memory cells have been all programmed to "0", coming directly from the assembly lines without having been through any quality test, are loaded in metal tubes (usually aluminun tubes) and placed in an oven at 170° C. for 72 hours.

The tubes containing the devices are then moved to an automatic machine for loading the devices on the special burn-in cards of the system of the invention. The loading robot provides for plugging the devices in the sockets of the card and, upon plugging, the card microprocessor verifies the presence or absence of short circuits at the outputs of the devices; in an affirmative case, the device is immediately unplugged from the socket and placed among rejects.

Each card, completely loaded with devices, is introduced into the burn-in oven and connected to the system's CPU.

The devices loaded on to the cards are then subjected to a dynamic burn-in treatment at 125° C. for 24 hours during which time the devices undergo the following tests:

(i) verification of state "0" retention by all EPROM cells;
(ii) erasure;
(iii) programming of a first test pattern;
(iv) verification of the first test pattern;
(v) repetition of steps (ii), (iii) and (iv) for a "n" number of different test patterns;
(vi) programming of a special checker-board pattern in order to prepare the EPROM devices for the subsequent dynamic testing for determining the access time (TAC).

The cards containing the devices are moved to an automatic machine or robot which provides for unplugging the devices from the sockets of the cards and, in function of the grade or classification attributed to the device (depending upon the results of the tests to which the device has been subjected) which has been memorized by the card microprocessor, to deposit the single devices into relative classified tubes.

Different lots of devices already classified in function of their shown performances in respect to the parametric testing and functional testing may be fed to an automatic testing apparatus for the determination of the access time (TAC) and for the relative further classification of the devices into quality grades.

The devices are then stamped and erased.

At this point the devices may be considered ready for shipment although a further checking of the erasure of the test data and/or an eventual second access time test may also be contemplated.

The described sequence may, of course, be made completely automatic by providing suitable transfer means for the cards and for the tubes.

The type, the number and the re-iteration of the various tests, as well as the residence times and the test temperatures may be also different from those indicated in order to satisfy particular requirements. In all cases the apparatus object of the present invention permits of essentially combining the burn-in test with functional and parametric testing of the EPROM devices, thus reducing in a large measure the test times and the handling of the devices besides permitting to perform the parametric and functional tests of the EPROM devices while they are being subjected to the burn-in treatment, thus ensuring a higher degree of reliability of the product.

What I claim is:

1. An apparatus for functional testing and for determining the characteristics of EPROM type semiconductor devices during a burn-in heat treatment, comprising means for erasing the EPROM by U.V. light irradiation of the devices, means for programming the EPROMs means for verifying the programming of the EPROMs means for performing the burn-in of the programmed devices, means for verifying the retention of the programmed data, means for measuring parametric (DC) and dynamic (TAC) characteristics of the devices and means for classifying and handling the single devices, characterized by the fact that it comprises essentially:

(a) at least a burn-in chamber provided, on at least a wall thereof, with a plurality of slots having automatic closing means and capable of receiving a card;

(b) a plurality of cards for mounting the devices to be tested, each card comprising a first part provided with a plurality of sockets, connected in parallel for plugging in the devices and a second part containing a microprocessor, a coupling body fitting into said slots being present between said first part and second part of the card, said second part of the cards remaining outside said chamber upon insertion of the card into one of said slots;

(c) a plurality of cards containing at least one U.V. lamp, each of said cards comprising a first part provided with at least one U.V. lamp and a second part containing switching and supply means for said lamp, a coupling body suitably fitting into said slots being present between said two parts of the card, the second part of the card remaining outside said chamber upon insertion of the card into one of said slots;

(d) a system's central processing unit (CPU) interfaced with the microprocessor of each of said cards for mounting the devices and with the switching means of each of said cards containing at least a U.V. lamp;

each of said U.V. lamps containing cards being functionally interposed between two cards of devices;

said microprocessors determining the performance of the following operations upon the devices: programming, verification of the programming, verification of retention of programmed data, classification of devices in terms of quality and identification of the devices under control of the system's central processing unit which coordinates the switching of said U.V. lamps for erasing operations.

2. The apparatus according to claim 1, wherein said slots for inserting said cards are defined through a wall of said burn-in chamber by a frame of insulating material having a central opening with a substantially rectangular cross section and tapered across the thickness of the wall of the chamber to form a port having a rectangular base, truncated p y r a m i d port with the major base of the truncated pyramid corresponding with the external surface of said wall.

3. The apparatus according to claim 2, wherein said slots are provided with individual automatic means for closing the central opening of the slot in absence of a card inserted into the slot itself.

4. The apparatus according to claim 1, wherein said cards are provided with a central coupling body shaped as a truncated pyramid plug and matching with the shape of said central opening of said slots.

5. The apparatus according to claim 1, wherein said microprocessor housed in the part of said cards for assembling the devices to be tested remaining outside the burn-in chamber upon insertion of the card into one of said slots, comprises a control unit, a read-only memory, a random access memory and input and output interfacing stages.

6. The apparatus according to claim 1, wherein said cards for mounting the devices are inserted inside the burn-in chamber through the slots of a front wall of said chamber and said cards carrying U.V. lamps are inserted inside the burn-in chamber through the slots of a back wall of said chamber.

* * * * *